(12) United States Patent
Kobayashi

(10) Patent No.: US 6,355,101 B1
(45) Date of Patent: Mar. 12, 2002

(54) FLUX TRANSFER APPARATUS

(75) Inventor: Shigeharu Kobayashi, Ishikawa (JP)

(73) Assignee: Shibuya Kogyo Co., Ltd., Ishikawa (JP)

( * ) Notice: Subject to any disclaimer, the term of this patent is extended or adjusted under 35 U.S.C. 154(b) by 0 days.

(21) Appl. No.: 09/397,115

(22) Filed: Sep. 16, 1999

(30) Foreign Application Priority Data

Sep. 25, 1998 (JP) .......................................... 10-288855

(51) Int. Cl.[7] ................................................. B05C 1/02
(52) U.S. Cl. ..................... 118/74; 118/216; 118/255; 228/41; 228/223; 228/224
(58) Field of Search .................... 118/74, 216, 255; 228/41, 246, 223, 224

(56) References Cited

U.S. PATENT DOCUMENTS 5,467,913 A * 11/1995 Namekawa et al. .......... 228/41
5,686,226 A    11/1997 Groman et al. .............. 430/325
6,003,757 A * 12/1999 Beaumont et al. .......... 228/246

FOREIGN PATENT DOCUMENTS

JP          8-266980          10/1996

* cited by examiner

*Primary Examiner*—Laura Edwards
(74) *Attorney, Agent, or Firm*—Sughrue, Mion, Zinn, Macpeak & Seas, PLLC

(57) ABSTRACT

A flux transfer apparatus has a frame having an aperture portion in its lower central portion, and a mesh is stretched across the frame with a high tension and with a mesh pitch at least smaller than the diameter of projections to be formed therein is used. Projections made of resin are provided in the mesh portion provided at the aperture portion of the frame.

5 Claims, 2 Drawing Sheets

FLUX TRANSFER APPARATUS

BACKGROUND OF THE INVENTION

1. Field of the Invention

The present invention relates to an improvement of a flux transfer apparatus for applying flux to a work such as a wiring portion or the like in order to remove oxidized film and to provisionally fix solder balls before the solder balls are mounted on a BGA (ball grid array) or wafer in a solder ball mount apparatus.

The present application is based on Japanese Patent Application No. Hei. 10-288855, which is incorporated herein by reference.

2. Description of the Related Art

As a system for transferring flux to a wiring portion of a wiring board or the like, there are generally known a pin transfer system, a ball dip system, a screen printing system, and a dispenser system. However, each of these systems has defects.

In the pin transfer system, the cost of attachment over a large area is high because individual pins are kept movable, and there is a limit in suitability to a very small pitch. In the ball dip system, since flux is supplied directly to solder balls held by a mount head, the flux is apt to adhere to the mount head when the solder balls are very small.

In the screen printing system, not only the maintenance is very troublesome, but also when there are irregularities in a wiring portion or the like to which flux is to be printed, it is impossible to cope with such irregularities. Further, in the dispenser system, a large number of dispensers are required to cover a large area, so that not only the cost of attachment becomes high impractically, but also variations are produced largely in the technical points.

On the other hand, there is a flux transfer apparatus of a stamp system which is not yet put into practical use. In the stamp system, a projection portion constituted by projections for stamping is formed in a transfer head. In this system, the cost of attachment is small, and the maintenance is easy. There is however a problem in accuracy, for example, such a problem that the stamping projections are apt to come off. In addition, it is impossible for the system to cope with irregularities in a work such as a wiring portion or the like. Accordingly, the stamp system has not been adopted yet.

In order to eliminate the defects of the stamp system, an object of the present invention is to provide a flux transfer apparatus of the stamp system, in which stamping projections are prevented from coming off while it is possible for the apparatus to cope with irregularities in a work such as a wiring portion or the like.

SUMMARY OF THE INVENTION

In order to solve the foregoing problem, according to the present invention, there is provided a flux transfer apparatus having a frame having an aperture portion, a mesh stretched across the aperture portion of the frame, and at least one projection on which flux is adhered, the projection being provided on the mesh, and a mesh pitch of the mesh being smaller than a diameter of the projection.

Features and advantages of the invention will be evident from the following detailed description of the preferred embodiments described in conjunction with the attached drawings.

DETAILED DESCRIPTION OF THE PREFERRED EMBODIMENTS

Figure 1:
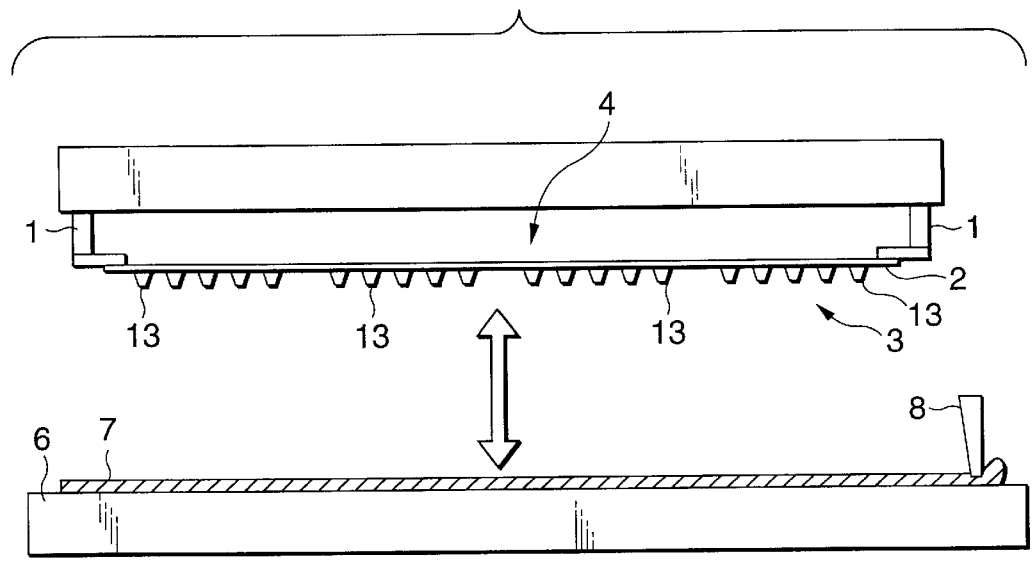
FIG. 1 is a side view showing a relationship between a flux transfer apparatus and a flux tray.

The present invention will be described below based on an embodiment illustrated in the drawings. FIG. 1 is a side view showing a relationship between a flux transfer apparatus and a flux tray. In FIG. 1, the flux transfer apparatus according to the present invention has a frame 1 mounted on the lower surface of a flux transfer head, a mesh 2 stretched across the frame 1, and a plurality of projections 13 provided in the mesh 1 erectly.

The frame 1 is rectangular corresponding to the size of the flux transfer head. The frame 1 is made horizontal at least in its lower surface, provided with an aperture portion 4 at the center thereof, and mounted on the lower surface of the flux transfer head. The mesh 2 is attached to the frame 1.

The wire diameter and pitch of the mesh 2 are fitted to the size of projections 13 to be formed on the mesh 2. That is, the mesh 2 has a mesh pitch which is smaller than the diameter of each of projections 13, and the mesh 2 used in the embodiment is made of a very thin stainless steel wire (in which the wire diameter is about 30 microns, and the mesh pitch is 65 microns). Such a mesh 2 has been used for screen printing, and it is therefore known.

Resin with high tensile strength, for example, resin which is used for a screen for screen print may be used as the material of the mesh 2. If the tension of the mesh 2 is insufficient, the mesh is extended undesirably so that each of the projections 13 adhering to the mesh 2 gets out of position to thereby reduce the accuracy in transfer of flux. Therefore, the mesh 2 is stretched across the frame 1 with a high tension. Either caulking or bonding may be used as the means for fixing.

In the embodiment, a plurality of projections 13 made of nylon resin is formed in a portion of the mesh 2 located in the aperture portion 4 of the frame 1. Although the resin forming the projection 13 is not limited to nylon resin, it is preferable to use resin having alcohol resistance. Other examples include acryl resin, epoxy resin, etc.

In order to mount solder balls each having a diameter of 0.3 mm on the projections 13 in the embodiment, inverted truncated-conical projections 13 each having a height of 0.4 mm, a diameter of 0.4 mm at the base portion attached to the mesh 2, and a diameter of 0.2 mm at the tip end portion are formed at a pitch of 0.5 mm. Although this size of the projections 13 in the embodiment is determined on the assumption that each solder ball has a diameter of 0.3 mm, the size of the projections 13 determined in accordance with the diameter of the solder balls. In this case, it will go well so long as the diameter of the tip end of each projection 13 is smaller than the diameter of the base portion thereof attached to the mesh 2. The pitch of the projections 13 may be set desirably in accordance with the pitch with which the solder balls are to be mounted.

Figure 4:
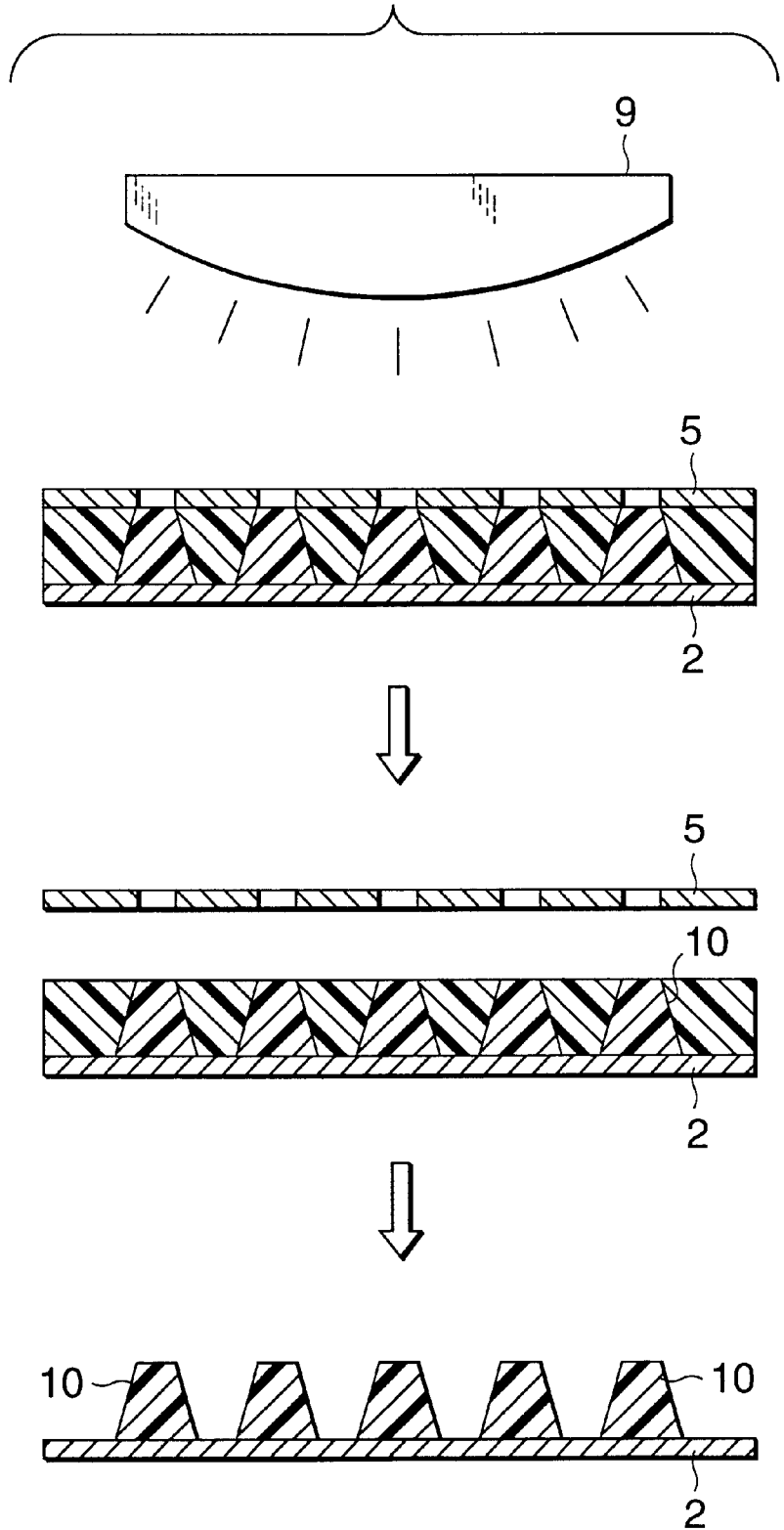
FIG. 4 is an explanatory diagram showing means for forming projections.

Projections 13 are formed in such a manner that photo-setting resin is applied onto the mesh 2 to a fixed thickness;

a mask 5 fitted to the desired shape of the projections is put on this resin if necessary; ultraviolet rays are irradiated from an ultraviolet ray generator 9 so as to harden the required portion of the resin; and hardened portions 10 are left after the mask 5 is separated. This steps are shown in FIG. 4. If the conditions of irradiation of ultraviolet rays or the shape of the mask is devised in this occasion, it is also possible to form projections 13 each having a slender tip end and a thick base as shown in FIG. 2.

Figure 2:
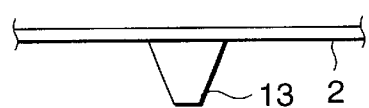
FIG. 2 is a side view showing a shape of a projection.
Figure 3:
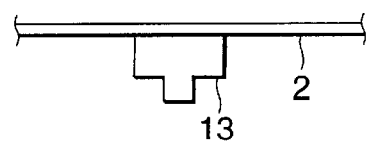
FIG. 3 is a side view showing another shape of a projection.

Preferably, each projection 13 is made to have not a straight shape but a trapezoid having a tapered front end as shown in FIG. 2 or a two-stages shape as shown in FIG. 3. The two-stages projections as shown in FIG. 3 may be formed by performing the above-mentioned projection forming method twice.

The use of the flux transfer apparatus according to the present invention is shown in FIG. 1. First, flux 7 in a flux tray 6 is extended to a uniform thickness by means of a squeegee 8. The flux transfer apparatus is made to come down on the flux tray 6 so that the flux 7 adheres to the individual projections 13 uniformly.

After the uniform adhering of the flux to the projections 13, the flux transfer apparatus is positioned on a work to which the flux is to be transferred, and the flux transfer apparatus is pressed from above so that all the projections 13 contact with the work. This pressure is determined in accordance with the material of the work and the material of the flux.

Configured as mentioned above, the present invention has the following effects. First, since projections are made to attached to a mesh, it is possible to prevent stamping projection from coming off, so that it is possible to improve the accuracy of transferring flux. That is, although the adhesion force of the stamping projections to a flat plate is so small that the projections may come off easily, the adhesion force of projections to a fine mesh is so large that the projections have durability in use. Accordingly, it is possible to provide a large number of stamping projections to make it possible to transfer flux over a large area in a lump.

Second, the portion where the projections are formed is a mesh having elasticity. Accordingly, even if there are irregularities in a portion to which flux is to be transferred, the irregularities can be followed by the elasticity of the mesh so that it is possible to transfer flux in spite of such irregularities. If the projections are formed on a plate used conventionally, the elasticity is small so that the irregularities cannot be followed. In addition, because of the elasticity of the mesh, the pressure to a product to which flux is not transferred can be reduced, and flux transfer can be realized without scattering.

Third, since the flux transfer apparatus is of a stamp system, the attachment cost for forming the projections or the like can be reduced regardless of the size, and the maintenance also becomes easy.

Although the invention has been described in its preferred form with a certain degree of particularity, it is understood that the present disclosure of the preferred form can be d arrangement of parts without departing from the spirit and the scope of the invention as hereinafter claimed.

What is claimed is:

1. A flux transfer apparatus comprising:

a frame having an aperture portion;

a mesh stretched across said aperture portion of said frame; and at least one projection on which flux is adhered, said projection being provided on said mesh, and a mesh pitch of said mesh being smaller than a diameter of said projection.

2. A flux transfer apparatus according to claim 1, wherein said projection is made of resin.

3. A flux transfer apparatus according to claim 1, wherein a diameter of a tip end of said projection is smaller than a diameter of base portion of said projection.

4. A flux transfer apparatus according to claim 3, wherein said projection has a truncated-conical shape.

5. A flux transfer apparatus according to claim 3, wherein said projection has a two-stage shape.

* * * * *